United States Patent
Seki et al.

(10) Patent No.: US 11,837,770 B2
(45) Date of Patent: Dec. 5, 2023

(54) DIRECTIONAL COUPLER

(71) Applicant: Murata Manufacturing Co., Ltd., Kyoto (JP)

(72) Inventors: Kenta Seki, Kyoto (JP); Ryangsu Kim, Kyoto (JP); Katsuya Shimizu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 351 days.

(21) Appl. No.: 17/186,171

(22) Filed: Feb. 26, 2021

(65) Prior Publication Data

US 2021/0184328 A1 Jun. 17, 2021

Related U.S. Application Data

(63) Continuation of application No. PCT/JP2019/033515, filed on Aug. 27, 2019.

(30) Foreign Application Priority Data

Aug. 30, 2018 (JP) ................................ 2018-161719

(51) Int. Cl.
*H01P 5/18* (2006.01)
*H01P 1/10* (2006.01)
*H03H 7/38* (2006.01)

(52) U.S. Cl.
CPC ................ *H01P 5/18* (2013.01); *H01P 1/10* (2013.01); *H03H 7/38* (2013.01)

(58) Field of Classification Search
CPC ............... H01P 5/18; H01P 1/10; H03H 7/38
See application file for complete search history.

(56) References Cited

U.S. PATENT DOCUMENTS

| 2002/0135458 A1* | 9/2002 | Drori ................. H03H 7/24 338/185 |
| 2007/0279147 A1 | 12/2007 | Dupont et al. |

(Continued)

FOREIGN PATENT DOCUMENTS

| CN | 106684518 A | 5/2017 |
| CN | 107431264 A | 12/2017 |

(Continued)

OTHER PUBLICATIONS

International Search Report issued in Application No. PCT/JP2019/033515, dated Oct. 8, 2019.

(Continued)

*Primary Examiner* — Samuel S Outten
(74) *Attorney, Agent, or Firm* — Pearne & Gordon LLP

(57) ABSTRACT

A directional coupler includes a main line and a sub-line electromagnetically coupled to each other, a variable termination circuit that is connected to one end of the sub-line and that has a variable impedance, a variable matching circuit that is connected to the other end of the sub-line and that has a variable impedance or a variable attenuator that has a variable attenuation, and a control circuit that controls the impedance of the variable termination circuit and that controls the impedance of the variable matching circuit or the attenuation of the variable attenuator. The control circuit includes a non-volatile memory and controls the impedance of the variable termination circuit in accordance with data stored in the memory.

14 Claims, 7 Drawing Sheets

(56) References Cited

U.S. PATENT DOCUMENTS

| | | | |
|---|---|---|---|
| 2013/0275702 A1 | 10/2013 | Miyazaki et al. | |
| 2014/0354173 A1 | 12/2014 | Matsuno | |
| 2017/0288634 A1* | 10/2017 | Kang | G11C 16/08 |
| 2018/0048046 A1 | 2/2018 | Noguchi et al. | |
| 2018/0062672 A1* | 3/2018 | Kim | H03F 3/24 |
| 2019/0020316 A1* | 1/2019 | Cheng | H03F 1/30 |

FOREIGN PATENT DOCUMENTS

| | | |
|---|---|---|
| JP | H04130603 A | 5/1992 |
| JP | 2009027617 A | 2/2009 |
| JP | 2013222232 A | 10/2013 |
| JP | 2014236435 A | 12/2014 |
| WO | 2016158314 A1 | 10/2016 |

OTHER PUBLICATIONS

Written Opinion issued in Application No. PCT/JP2019/033515, dated Oct. 8, 2019.

* cited by examiner

DIRECTIONAL COUPLER

CROSS REFERENCE TO RELATED APPLICATION

This is a continuation of International Application No. PCT/JP2019/033515 filed on Aug. 27, 2019 which claims priority from Japanese Patent Application No. 2018-161719 filed on Aug. 30, 2018. The contents of these applications are incorporated herein by reference in their entireties.

BACKGROUND

Technical Field

The present disclosure relates to a directional coupler including a main line and a sub-line that are electromagnetically coupled to each other.

Directional couplers including main lines and sub-lines that are electromagnetically coupled to each other are used to extract power (that is, traveling waves) of radio-frequency signals that are propagated on the lines in a forward direction. In such a directional coupler, a termination resistor is connected to one end of the sub-line (for example, refer to Patent Document 1).

Patent Document 1: Japanese Unexamined Patent Application Publication No. 2009-27617

BRIEF SUMMARY

However, the directional coupler disclosed in Patent Document 1, in which the termination resistor is connected to one end of the sub-line, has a problem in that the resistance value of the termination resistor is varied not to achieve stable directivity. The directivity is a value indicating the capability to discriminate between the traveling waves and reflected waves, which are extracted by the directional coupler. In the directional couplers, for example, the directional coupler disclosed in Patent Document 1, the frequency at which the directivity is maximized is varied for each directional coupler.

In order to resolve the above problem, use of a variable termination circuit capable of varying the resistance value as the termination resistor and correction of the impedance of the variable termination circuit are considered. However, in this case, there is a problem in that the impedance at the other end of the sub-line (that is, output impedance) is varied due to the difference in the amount of correction for each directional coupler not to achieve stable return loss. The return loss is a reciprocal of the ratio of the reflected waves with respect to incident waves (that is, the reciprocal of a reflection coefficient) and indicates the degree of matching.

The present disclosure provides a directional coupler capable of achieving the directivity and the return loss more stable than those of directional couplers in related art.

A directional coupler according to an embodiment of the present disclosure includes a main line and a sub-line electromagnetically coupled to each other, a variable termination circuit that is connected to one end of the sub-line and that has a variable impedance, a variable matching circuit that is connected to the other end of the sub-line and that has a variable impedance or a variable attenuator that has a variable attenuation, and a control circuit that controls the impedance of the variable termination circuit and that controls the impedance of the variable matching circuit or the attenuation of the variable attenuator. The control circuit includes a non-volatile memory and controls the impedance of the variable termination circuit in accordance with data stored in the memory.

The present disclosure provides a directional coupler capable of achieving the directivity and the return loss more stable than those of directional couplers in the related art.

DETAILED DESCRIPTION

Figure 1:
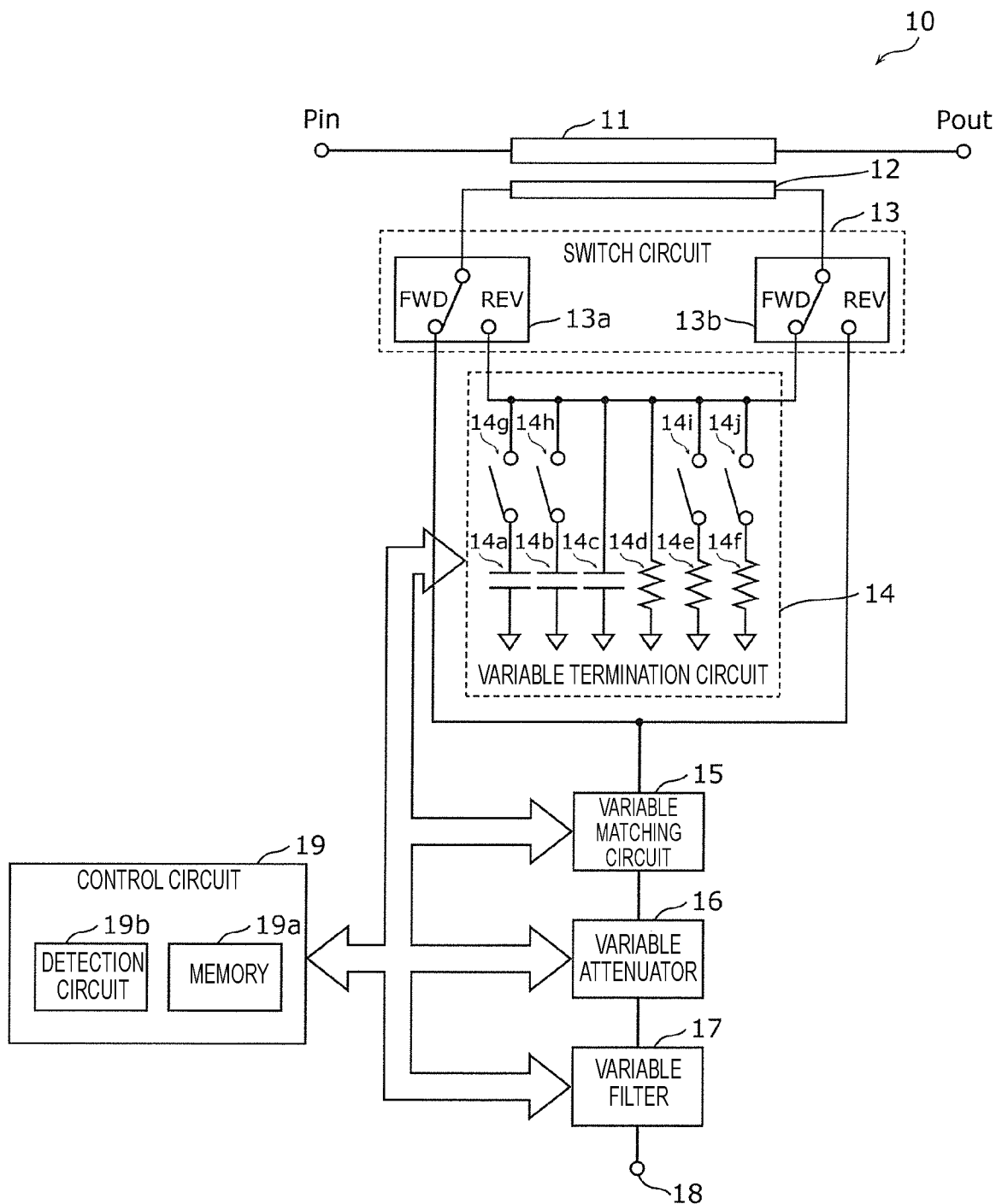
FIG. 1 is a block diagram illustrating the configuration of a directional coupler according to an embodiment.

Embodiments of the present disclosure will herein be described in detail with reference to the drawings. All the embodiments described below indicate specific examples of the present disclosure. Numerical values, shapes, materials, components, the positions where the components are arranged, the connection mode of the components, steps, the order of the steps, and so on, which are indicated in the embodiments described below, are only examples and are not intended to limit the present disclosure. Among the components in the embodiments described below, the components that are not described in the independent claims indicating the highest-level concepts of the present disclosure are described as optional components. In addition, the drawings are not necessarily strictly indicated. The same reference numerals are used in the respective drawings to identify substantially the same components and a duplicated description of such components may be omitted or simplified.

FIG. 1 is a block diagram illustrating the configuration of a directional coupler 10 according to an embodiment. The directional coupler 10 is a bidirectional coupler capable of selectively extracting traveling waves and reflected waves on a line (the power of radio-frequency signals propagated on the line in the opposite directions). The directional coupler 10 includes a main line 11, a sub-line 12, a switch circuit 13, a variable termination circuit 14, a variable matching circuit 15, a variable attenuator 16, a variable filter 17, a coupling port 18, and a control circuit 19.

The main line 11 is a line connected in series to the line from which the traveling waves and the reflected waves are extracted. Here, on the main line 11, the power travelling from a left-side terminal Pin to a right-side terminal Pout in FIG. 1 is referred to as the traveling waves and the power travelling in the opposite direction is referred to as the reflected waves.

The sub-line 12 is a line that is electromagnetically connected to the main line 11 and that extracts the traveling waves or the reflected waves.

The switch circuit 13 is a circuit to switch between the extraction of the traveling waves and the extraction of the reflected waves using the directional coupler 10. The switch circuit 13 is composed of two switch elements 13a and 13b controlled by the control circuit 19 or an external circuit (that is, a circuit placed outside the directional coupler 10). The traveling waves are extracted by the directional coupler 10 when common terminals are connected to left-side terminals ("FWD") in FIG. 1 in the two switch elements 13a and 13b, and the reflected waves are extracted by the directional coupler 10 when the common terminals are connected to right-side terminals ("REV") in FIG. 1 in the two switch elements 13a and 13b.

The switch elements 13a and 13b are radio-frequency switches that are turned on or off in response to a control signal that is externally input. Each of the switch elements 13a and 13b is, for example, a field effect transistor (FET) The same applies to all the switch elements described below.

The variable termination circuit 14 is a circuit that is connected to one end of the sub-line 12 via the switch circuit 13 and that has a variable impedance. The impedance of the variable termination circuit 14 can be controlled in response to the control signals supplied from the control circuit 19 and the external circuit. In the present embodiment, the variable termination circuit 14 includes multiple impedance elements 14a to 14f and switch elements 14g to 14j connected to the four impedance element 14a, 14b, 14e, and 14f, respectively, among the multiple impedance elements 14a to 14f. Although the case is illustrated in FIG. 1 in which the variable termination circuit 14 includes the multiple switch elements, it is sufficient for at least one switch element to be provided. In other words, it is sufficient for the variable termination circuit 14 to include the switch element connected to at least one impedance element, among the multiple impedance elements 14a to 14f.

More specifically, the multiple impedance elements 14a to 14f include multiple capacitances (the impedance elements 14a to 14c) connected in parallel to each other, and the multiple switch elements 14g to 14j include the multiple switch elements 14g and 14h that are connected in parallel to each other and that are connected in series to the multiple capacitances (the impedance element 14a and impedance elements 14b), respectively. The multiple impedance elements 14a to 14f include multiple resistors (the impedance elements 14d to 14f) connected in parallel to each other, and the multiple switch elements 14g to 14j include the multiple switch elements 14i and 14j that are connected in parallel to each other and that are connected in series to the multiple resistors (the impedance elements 14e and 14f), respectively. The impedance elements 14a to 14f may be not only lumped constant circuit elements but also distributed constant circuit elements.

The multiple switch elements 14g to 14j include the switch elements (for example, the switch elements 14g and 14i) that are turned on or off under the control of the control circuit 19, which is based on data stored in a memory 19a, (that is, for trimming) and the switch elements (for example, the switch elements 14h and 14j) that are turned on or off under the control of the control circuit 19 and the external circuit, which is not based on the data stored in the memory 19a, (that is, for tuning). Each of the switch elements for tuning (for example, the switch elements 14h and 14j) is an example of a controlled unit that varies the impedance of the variable termination circuit 14 under the control that is not based on the data stored in the memory 19a. The control of the variable termination circuit 14, which is not based on the data stored in the memory 19a, means control of the variable termination circuit 14 based on information other than the data stored in the memory 19a and is, for example, dynamic adjustment of the impedance of the variable termination circuit 14, which is matched with the frequency band of the radio-frequency signal propagated on the main line 11.

Although the multiple switch elements 14g to 14j are connected to the impedance elements composed of the capacitances and the resistors in the present embodiment, the connection mode of the multiple switch elements 14g to 14j is not limited to this. The multiple switch elements 14g to 14j may be connected only to the impedance elements composed of the capacitances or may be connected only to the impedance elements composed of the resistors. In addition, the mixture of the capacitances and the resistors is not limitedly used as the impedance elements included in the variable termination circuit 14. Only the capacitances may be used as the impedance elements included in the variable termination circuit 14 or only the resistors may be used as the impedance elements included in the variable termination circuit 14.

The variable matching circuit 15 is a circuit that is connected to the other end of the sub-line 12 via the switch circuit 13 and that has a variable impedance. In other words, the signal extracted on the sub-line 12 is input into the variable matching circuit 15. The variable matching circuit 15 is provided to improve the loss caused by the reflected waves from the coupling port 18 by adjusting output impedance at the coupling port 18. The impedance of the variable matching circuit 15 can be controlled in response to the control signals from the control circuit 19 and the external circuit.

The variable attenuator 16 is an attenuator that is connected to the other end of the sub-line 12 and that has a variable attenuation. In the present embodiment, the variable attenuator 16 is connected to the other end of the sub-line 12 via the switch circuit 13 and the variable matching circuit 15. In other words, the signal extracted from the variable matching circuit 15 is input into the variable attenuator 16. The variable attenuator 16 is provided to enable adjustment of the degree of coupling of the directional coupler 10. The attenuation of the variable attenuator 16 can be controlled in response to the control signals from the control circuit 19 and the external circuit. The degree of coupling means the ratio between the power propagated on the line in the forward direction and the power extracted at the coupling port 18.

The variable filter 17 is a filter that is connected to the other end of the sub-line 12 via the switch circuit 13, the variable matching circuit 15, and the variable attenuator 16 and that has a variable pass band. In other words, the signal output from the variable attenuator 16 is input into the variable filter 17. The variable filter 17 is, for example, a low pass filter having a variable pass band and is provided to reduce the frequency dependence of the degree of coupling of the directional coupler 10. The pass band of the variable filter 17 can be controlled in response to the control signals from the control circuit 19 and the external circuit.

The coupling port 18 is a terminal from which the signal extracted by the directional coupler 10 is output.

The control circuit 19 is an example of a control circuit that controls the impedance of the variable termination circuit 14 and that controls the impedance of the variable matching circuit 15 or the attenuation of the variable attenuator 16. The control circuit 19 includes the memory 19a and a detection circuit 19b. In the present embodiment, the control circuit 19 controls (performs trimming of) the impedance of the variable termination circuit 14, the impedance of the variable matching circuit 15, the attenuation of the variable attenuator 16, and the pass band of the variable filter 17 in accordance with the data stored in the memory 19a. For example, the control circuit 19 short-circuits or opens the switch elements 14g to 14j in accordance with the data stored in the memory 19a to control the impedance of the variable termination circuit 14. Specifically, the control circuit 19 may be realized by a logic circuit, such as the one described below (FIG. 6), may include a communication circuit communicating with the external circuit, or may include a microcomputer incorporating programs.

The memory 19a is a non-volatile memory. Specifically, in the present embodiment, the memory 19a is a storage unit composed of multiple memory devices, such as electrical fuses, capable of performing writing only once and stores data that has been written in advance. The memory device capable of performing writing only once is a write-once memory device and is a memory device of a type in which deletion and modification of the data that has been written are disabled. In the present embodiment, data corresponding to the control of the impedance of the variable termination circuit 14, the impedance of the variable matching circuit 15, the attenuation of the variable attenuator 16, and the pass band of the variable filter 17 (that is, data corresponding to the trimming) is stored in the memory 19a in advance.

The detection circuit 19b is an example of a circuit that detects the impedance of the variable termination circuit 14 to generate the data to be stored in the memory 19a based on the detected impedance. The detection circuit 19b includes, for example, a replica of the variable termination circuit 14 (that is, a circuit imitating the variable termination circuit 14) and indirectly detects the impedance of the variable termination circuit 14 using the replica. In the manufacturing stage of the directional coupler 10, the impedance of the variable termination circuit 14 is detected by the detection circuit 19b, data used for adjusting the impedance of the variable termination circuit 14 to a desired value (that is, data for the trimming) is generated by the control circuit 19 or the external circuit based on the detected impedance, and the generated data is written to the memory 19a.

After the manufacturing (after the data is stored in the memory 19a), the detection of the impedance of the variable termination circuit 14 by the detection circuit 19b may also be used for the adjustment of the impedance of the variable termination circuit 14, the impedance of the variable matching circuit 15, the attenuation of the variable attenuator 16, and the pass band of the variable filter 17 by the control circuit 19 or the external circuit (that is, for the tuning, which is dynamic adjustment in the use of the directional coupler 10 after the manufacturing).

Figure 2:
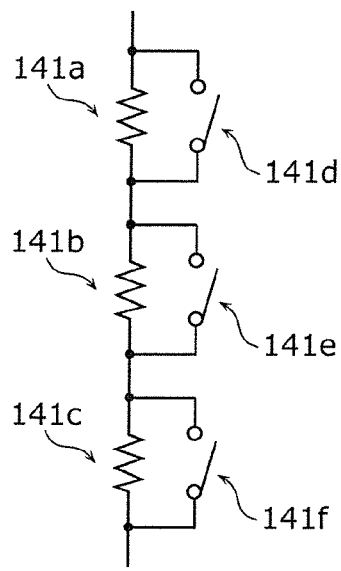
FIG. 2 is a diagram illustrating an example of a variable termination circuit according to a modification of the present embodiment.

Although the variable termination circuit 14 is the circuit in which the multiple series circuits of the impedance elements and the switch elements are connected in parallel to each other in FIG. 1, the configuration of the variable termination circuit 14 is not limited to this configuration. FIG. 2 is a diagram illustrating a configuration example of a variable termination circuit according to a modification of the present embodiment. The variable termination circuit according to the present modification includes multiple resistors 141a to 141c connected in series to each other as the multiple impedance elements and includes multiple switch elements 141d to 141f connected in parallel to the multiple resistors 141a to 141c, respectively, as the multiple switch elements. Such a variable termination circuit may be included as the whole or part of the variable termination circuit 14 according to the above embodiment. In other words, in the variable termination circuit 14 according to the present embodiment, all or part of the multiple impedance elements may be connected in series to each other or all or part of the multiple switch elements may be connected in parallel to the corresponding impedance elements. This enables the value of the impedance of the variable termination circuit, which is determined by the combination of turning-on and turning-off the respective switch elements, to be further varied.

Although the case is illustrated in FIG. 2 in which the multiple switch elements are provided, it is sufficient for at least one switch element to be provided. In other words, it is sufficient for the variable termination circuit according to the modification of the present embodiment to include one switch element connected in parallel to at least one impedance element, among the multiple impedance elements (the resistors 141a to 141c).

Figure 3:
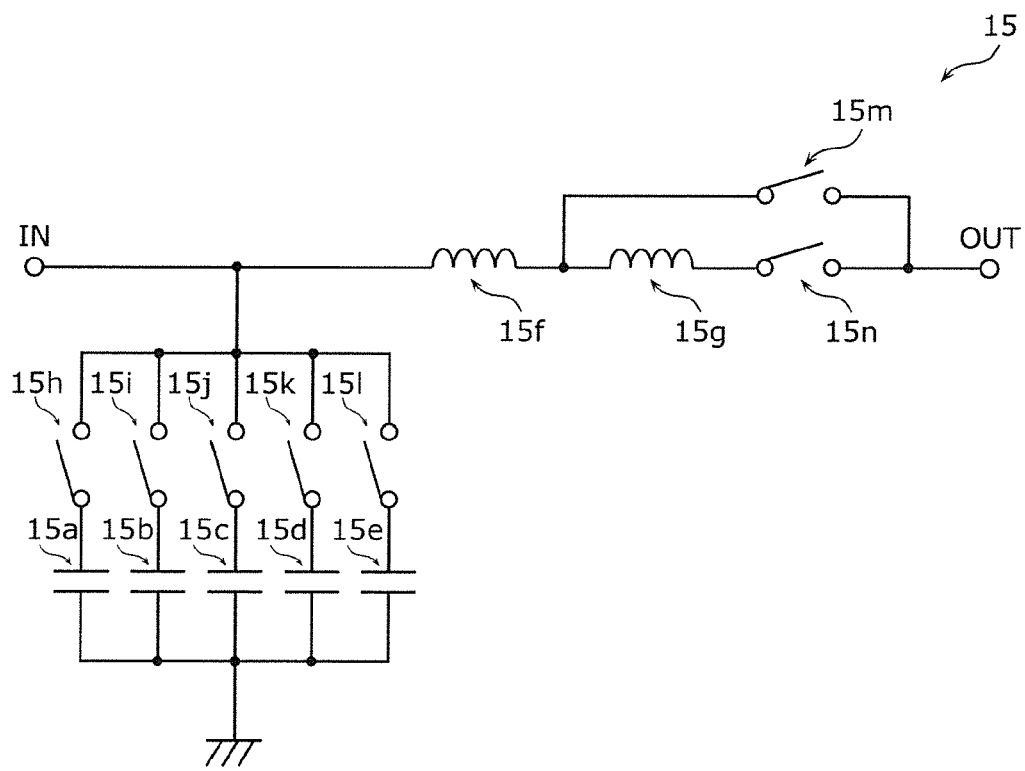
FIG. 3 is a diagram illustrating a detailed circuit example of a variable matching circuit illustrated in FIG. 1.

FIG. 3 is a diagram illustrating a detailed circuit example of the variable matching circuit 15 illustrated in FIG. 1. The variable matching circuit 15 is a circuit capable of varying the impedance using multiple capacitances and multiple inductors. The variable matching circuit 15 is composed of five capacitances 15a to 15e connected between a path between an input terminal IN and an output terminal OUT and ground, inductors 15f and 15g provided on the path, and switch elements 15h to 15n provided for the capacitances 15a to 15e and the inductors 15f and 15g, respectively.

In the present embodiment, the switch elements 15h to 15n include the switch elements (for example, the switch elements 15h to 15j, 15m, and 15n) that are turned on or off under the control of the control circuit 19, which is based on the data stored in the memory 19a, (that is, for trimming) and the switch elements (for example, the switch elements 15k and 15l) that are turned on or off under the control of the control circuit 19 and the external circuit, which is not based on the data stored in the memory 19a, (that is, for tuning). Each of the switch elements for tuning (for example, the switch elements 15k and 15l) is an example of a controlled unit that varies the impedance of the variable matching circuit 15 under the control that is not based on the data stored in the memory 19a. The control of the variable matching circuit 15, which is not based on the data stored in the memory 19a, means control of the variable matching circuit 15 based on information other than the data stored in the memory 19a and is, for example, dynamic adjustment of the impedance of the variable matching circuit 15, which is matched with the frequency band of the radio-frequency signal propagated on the main line 11.

Figure 4A:
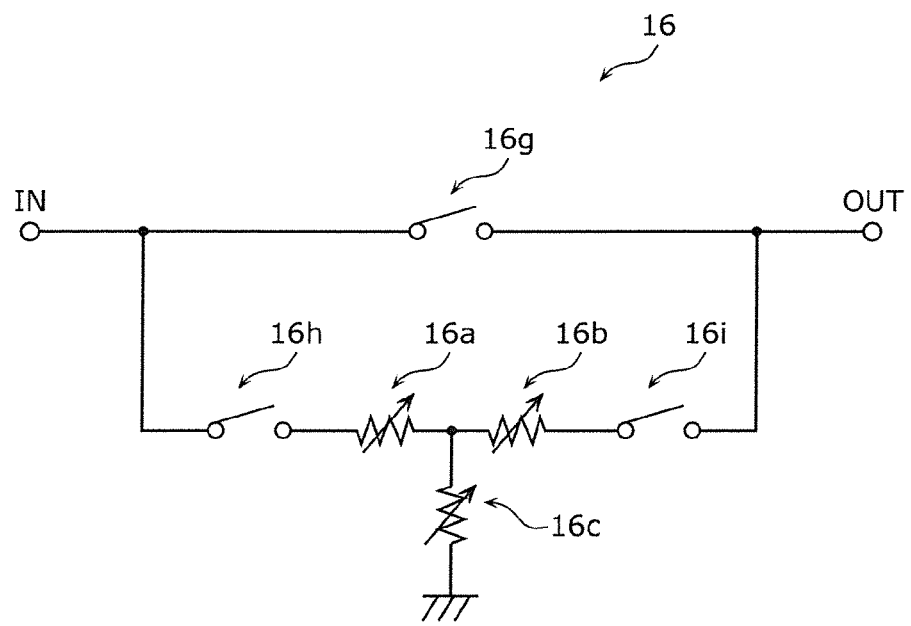
FIGS. 4A and 4B include diagrams illustrating a detailed circuit example of a variable attenuator illustrated in FIG. 1.
Figure 4B:
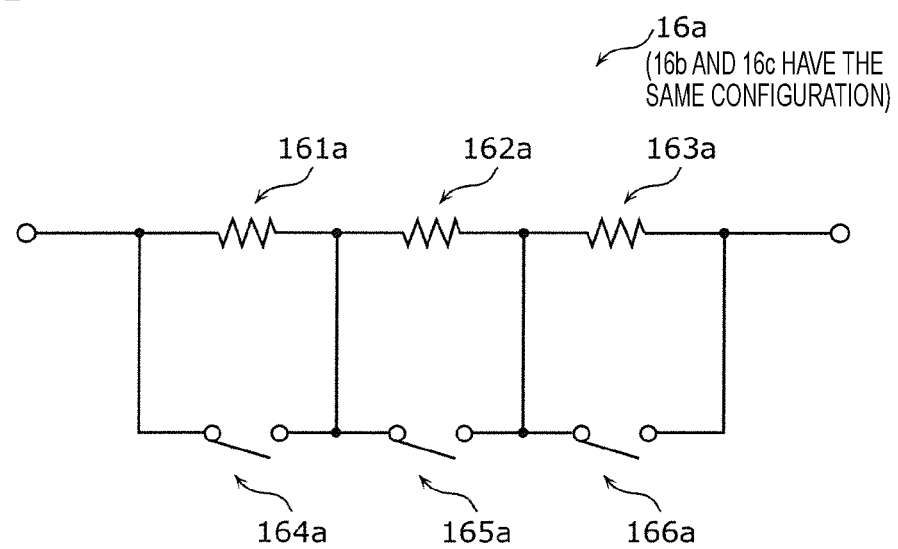

FIGS. 4A and 4B include diagrams illustrating a detailed circuit example of the variable attenuator 16 illustrated in FIG. 1. The variable attenuator 16 is a circuit that can vary the attenuation of the signal using multiple resistors. FIG. 4A illustrates the variable attenuator 16 composed of variable resistors 16a to 16c connected in one T-shaped pattern and three switch elements 16g to 16i for connecting or disconnecting part of the variable resistors 16a to 16c. FIG. 4B illustrates three resistors 161a to 163a connected in series to each other and switch elements 164a to 166a connected in parallel to the respective resistors as an example of the variable resistor 16a included in the variable attenuator 16. The three resistors 161a to 163a have, for example, different resistance values. The variable resistor 16a illustrated in FIG. 4B is applicable to the variable resistors 16b and 16c. The three resistors 161a to 163a may have, for example, the same resistance value.

In the present embodiment, for example, the switch elements 164a to 166a are the switch elements that are turned on or off under the control of the control circuit 19, which is based on the data stored in the memory 19a, (that is, for trimming) and the switch elements 16g to 16i are the switch elements that are turned on or off under the control of the control circuit 19 and the external circuit, which is not based on the data stored in the memory 19a, (that is, for tuning). Each of the switch elements for tuning (for example, the switch elements 16g to 16i) is an example of a controlled unit that varies the attenuation of the variable attenuator 16 under the control that is not based on the data stored in the memory 19a. The control of the variable attenuator 16, which is not based on the data stored in the memory 19a, means control of the variable attenuator 16 based on information other than the data stored in the memory 19a and is, for example, dynamic adjustment of the attenuation of the variable attenuator 16, which is matched with the frequency band of the radio-frequency signal propagated on the main line 11.

Figure 5A:
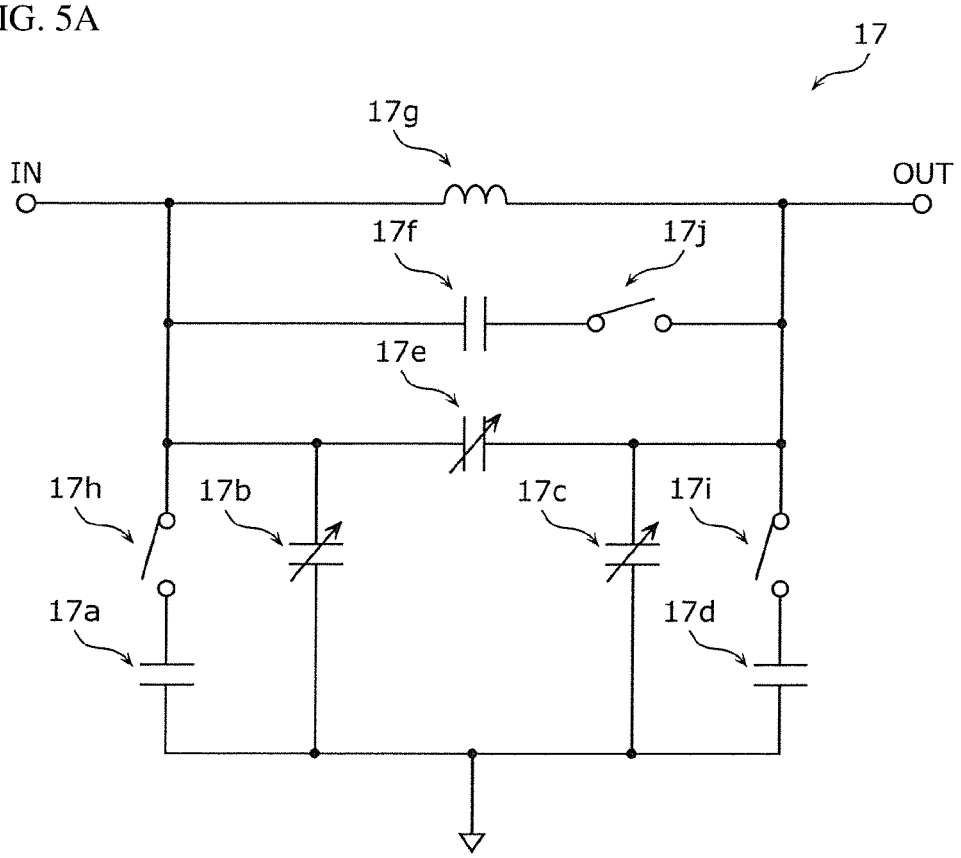
FIGS. 5A and 5B include diagrams illustrating a detailed circuit example of a variable filter illustrated in FIG. 1.
Figure 5B:
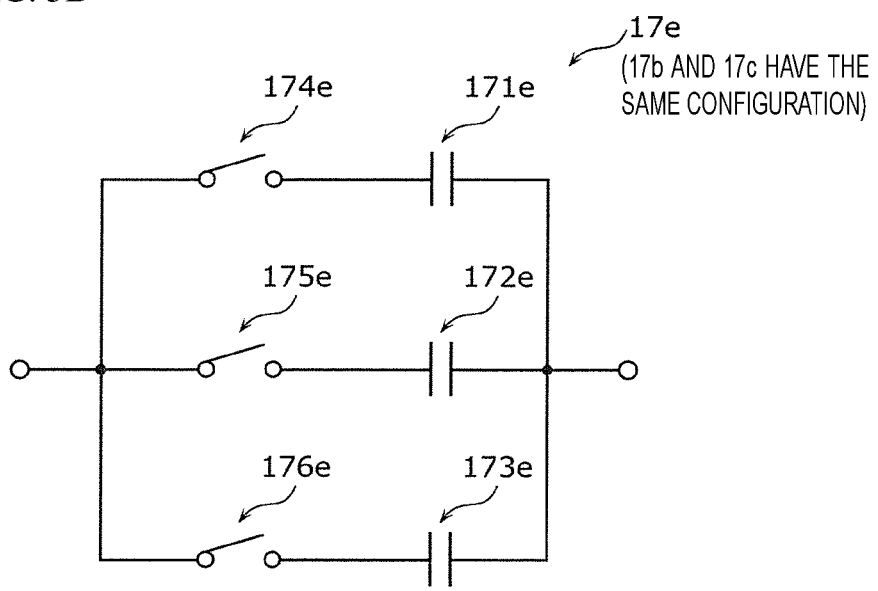

FIGS. 5A and 5B include diagrams illustrating a detailed circuit example of the variable filter 17 illustrated in FIG. 1. The variable filter 17 is a low pass filter capable of varying its pass band. FIG. 5A illustrates the variable filter 17 composed of four capacitances 17a to 17d connected between the path from the input terminal IN to the output terminal OUT and the ground, two capacitances 17e and 17f and one inductor 17g connected on the path or connected in parallel to the path, and switch elements 17h to 17j connected in series to the capacitances 17a and 17d and the capacitance 17f, respectively. The capacitances 17b, 17c, and 17e are variable capacitances. FIG. 5B illustrates three capacitances 171e to 173e connected in parallel to each other and switch elements 174e to 176e connected in series to the respective capacitances as an example of the capacitance 17e. The three capacitances 171e to 173e have, for example, different capacitance values. The configuration of the variable capacitance illustrated in FIG. 5B is applicable to the capacitances 17b and 17c.

In the present embodiment, the switch elements 174e to 176e are the switch elements that are turned on or off under the control of the control circuit 19, which is based on the data stored in the memory 19a, (that is, for trimming) and the switch elements 17h to 17j are the switch elements that are turned on or off under the control of the control circuit 19 and the external circuit, which is not based on the data stored in the memory 19a, (that is, for tuning). Each of the switch elements for tuning (for example, the switch elements 17h to 17j) is an example of a controlled unit that varies the pass band of the variable filter 17 under the control that is not based on the data stored in the memory 19a. The control of the variable filter 17, which is not based on the data stored in the memory 19a, means control of the variable filter 17 based on information other than the data stored in the memory 19a and is, for example, dynamic adjustment of the pass band of the variable filter 17, which is matched with the frequency band of the radio-frequency signal propagated on the main line 11.

Figure 6:
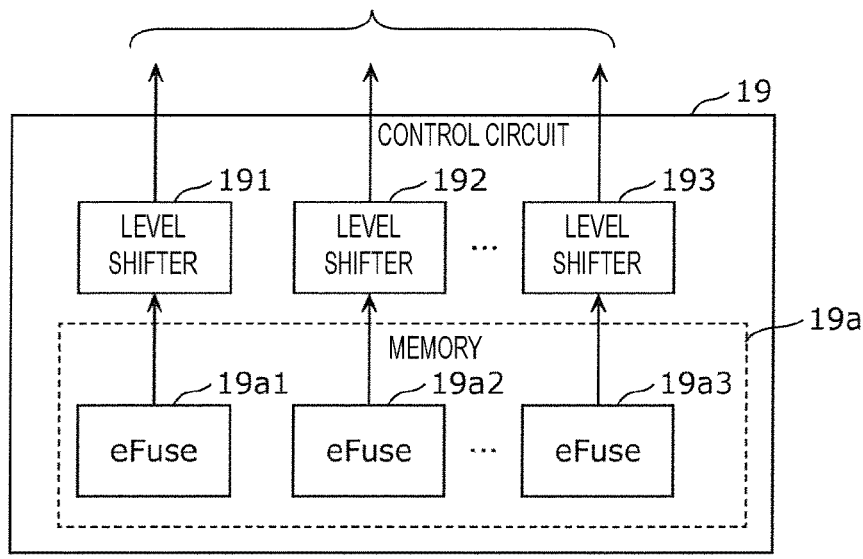
FIG. 6 is a block diagram illustrating a detailed configuration example of a control circuit illustrated in FIG. 1.

FIG. 6 is a block diagram illustrating a detailed configuration example of the control circuit 19 illustrated in FIG. 1. The memory 19a in the control circuit 19 and a circuit for outputting the control signals corresponding to the data stored in the memory 19a are illustrated here. The illustration of the detection circuit 19b is omitted in FIG. 6.

As illustrated in FIG. 6, the memory 19a is composed of electrical fuses 19a1 to 19a3, which are multiple memory devices. The multiple electrical fuses 19a1 to 19a3 are conducted or blown out (that is, data is written to the electrical fuses 19a1 to 19a3) based on whether the corresponding switch elements for trimming of the variable termination circuit 14 (for example, the switch elements 14g and 14i), the corresponding switch elements for trimming of the variable matching circuit 15 (for example, the switch elements 15h to 15j, 15m, and 15n), the corresponding switch elements for trimming of the variable attenuator 16 (for example, the switch elements 164a to 166a), and the corresponding switch elements for trimming of the variable filter 17 (for example, the switch elements 174e to 176e) are turned on or off.

In addition, as illustrated in FIG. 6, the control circuit 19 includes level shifters 191 to 193 corresponding to the multiple electrical fuses 19a1 to 19a3, respectively, in the memory 19a. The level shifters 191 to 193 are direct current-direct current (DC-DC) converters that increase or decrease the voltages occurring based on the states (conducted or blown out) of the corresponding electrical fuses 19a1 to 19a3 to voltages suitable to control the corresponding switch elements for trimming. The control circuit 19 outputs the voltages that are increased or decreased, which are output from the level shifters 191 to 193, to the corresponding switch elements for trimming to control (perform trimming of) the impedance of the variable termination circuit 14, the impedance of the variable matching circuit 15, the attenuation of the variable attenuator 16, and the pass band of the variable filter 17.

When the FETs are used for the above respective switch elements, the respective switch elements are controlled in response to application of the voltages output from the level shifters 191 to 193, that is, the voltages occurring based on the states of the electrical fuses 19a1 to 19a3 to the gate electrodes of the respective FETs.

The state (conducted or blown out) of each electrical fuse and the state (short-circuited or opened) of the corresponding switch element for trimming have the following correspondence. Typically, the blown-out of the electrical fuse generates High voltage and the switch element for trimming is short-circuited in response to the High voltage output from the level shifter. In contrast, the conduction of the electrical fuse generates Low voltage and the switch element for trimming is opened in response to the Low voltage output from the level shifter. However, the opposite correspondence may be established depending on selection of the conductivity type (P type or N type) of the peripheral circuit connected to the electrical fuse and the switch element.

Examples of how to store data in the memory 19a in the directional coupler 10 according to the present embodiment, which is configured in the above manner, (that is, trimming examples) will now be described.

Figure 7A:
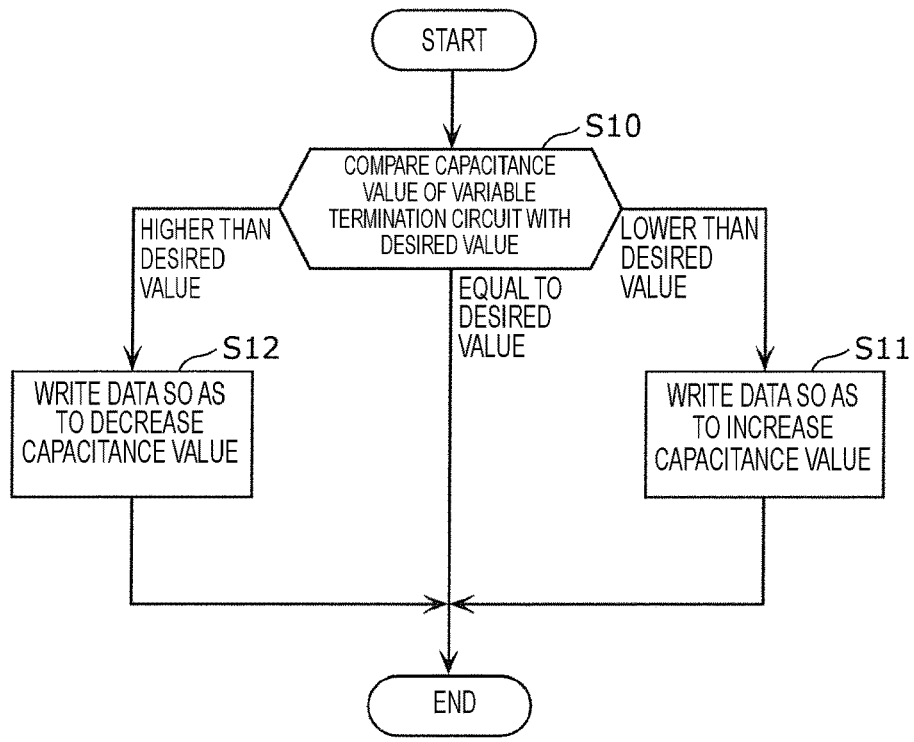
FIG. 7A is a flowchart indicating an example of how to store data (data for controlling the capacitance value of the variable termination circuit) in a memory in the directional coupler according to the present embodiment.

FIG. 7A is a flowchart indicating an example of how to store data (data for controlling the capacitance value of the variable termination circuit 14 here) in the memory 19a in the directional coupler 10 according to the present embodiment.

First, a capacitance component (capacitance value) in the impedance of the variable termination circuit 14 is compared with the desired value (S10).

If it is determined that the capacitance component (capacitance value) in the impedance of the variable termination circuit is lower than the desired value ("lower than desired value" in S10), the data is written to the memory 19*a* so as to increase the capacitance value in the variable termination circuit (S11). For example, in the variable termination circuit 14, the data is written to the memory 19*a* so that the number of the switch elements that short-circuit the impedance elements composed of the capacitances is greater than the number of the switch elements that open the impedance elements composed of the capacitances. Specifically, when the switch element 14*h* is the switch element for trimming, in addition to the switch element 14*g*, in the variable termination circuit 14 illustrated in FIG. 1, the data is written to the memory 19*a* with a writing circuit placed outside the directional coupler 10 or a writing circuit (not illustrated) incorporated in the control circuit 19 or the like in the control circuit 19 so that all the switch elements 14*g* and 14*h* for trimming are short-circuited. In this case, for example, if the capacitance component (capacitance value) in the impedance of the variable termination circuit 14 after mass production is varied toward a direction lower than the desired value, performing the trimming to increase the capacitance component (capacitance value) in the impedance of the variable termination circuit 14 enables the variation to be corrected.

If it is determined that the capacitance component (capacitance value) in the impedance of the variable termination circuit is higher than the desired value ("higher than desired value" in S10), the data is written to the memory 19*a* so as to decrease the capacitance value in the variable termination circuit (S12). For example, in the variable termination circuit 14, the data is written to the memory 19*a* so that the number of the switch elements that short-circuit the impedance elements composed of the capacitances is smaller than the number of the switch elements that open the impedance elements composed of the capacitances (S13). Specifically, when the switch element 14*h* is the switch element for trimming, in addition to the switch element 14*g*, in the variable termination circuit 14 illustrated in FIG. 1, the data is written to the memory 19*a* with the writing circuit placed outside the directional coupler 10 or the writing circuit (not illustrated) incorporated in the control circuit 19 or the like in the control circuit 19 so that all the switch elements 14*g* and 14*h* for trimming are opened. In this case, for example, if the capacitance component (capacitance value) in the impedance of the variable termination circuit 14 after mass production is varied toward a direction higher than the desired value, performing the trimming to decrease the capacitance component (capacitance value) in the impedance of the variable termination circuit 14 enables the variation to be corrected.

If it is determined that the capacitance component (capacitance value) in the impedance of the variable termination circuit is equal to the desired value ("equal to desired value" in S10), the capacitance value is not particularly adjusted.

The data may be written to the memory 19*a* with the writing circuit placed outside the directional coupler 10 or the writing circuit (not illustrated) incorporated in the control circuit 19 or the like in the control circuit 19 so that both the switch elements to be short-circuited and the switch elements to be opened exist in the variable termination circuit 14 depending on the detected impedance of the variable termination circuit 14. For example, when the switch element 14*h* is the switch element for trimming, in addition to the switch element 14*g*, in the variable termination circuit 14 illustrated in FIG. 1, the data may be written to the memory 19*a* so that the switch element 14*g* is short-circuited and the switch element 14*h* is opened, among the switch elements 14*g* and 14*h* for trimming. In this case, for example, combination of the adjustment to decrease the impedance of the variable termination circuit 14 after mass production with the adjustment to increase the impedance of the variable termination circuit 14 after mass production may enable the correction of the variation with higher accuracy.

As an example, when half of all the switch elements for trimming in the variable termination circuit 14 is short-circuited and the remaining half of them is opened, the number, the kind, the connection mode, and so on of the impedance elements and the switch elements for trimming are designed so that the impedance of the variable termination circuit 14 has a median within a variable range and a target value. This enables the variation to be corrected in many cases, for example, if the impedance of the variable termination circuit 14 after mass production is varied.

Figure 7B:
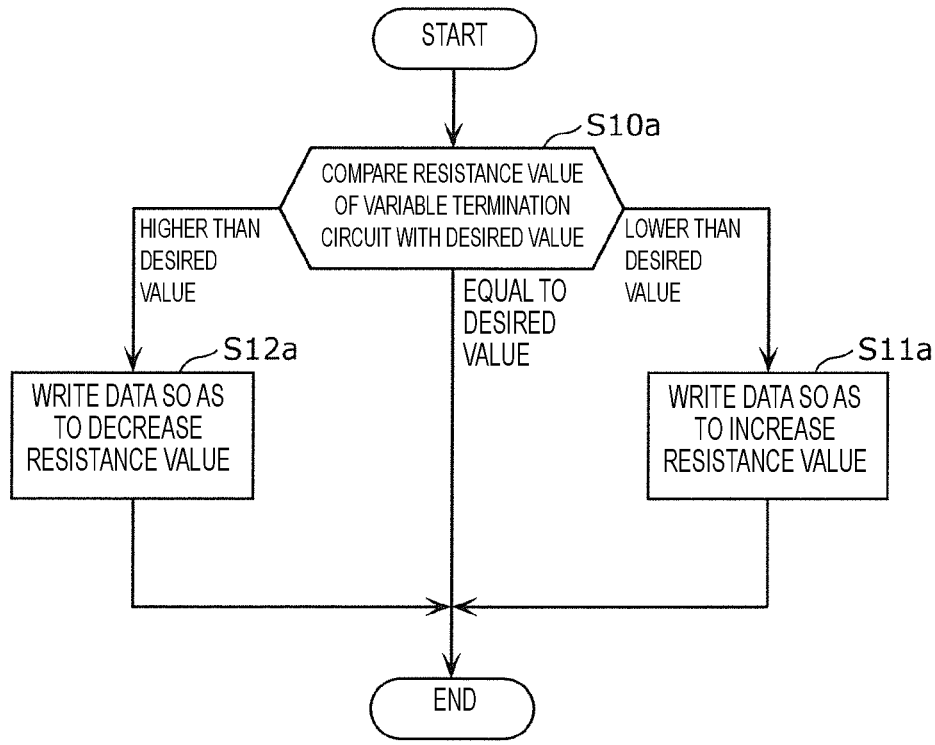
FIG. 7B is a flowchart indicating an example of how to store data (data for controlling the resistance value of the variable termination circuit) in the memory in the directional coupler according to the present embodiment.

Although the trimming example for the capacitance component in the impedance of the variable termination circuit 14 is indicated in FIG. 7A, data to increase or decrease the resistance value of the variable termination circuit 14 may be written to the memory 19*a* so as to suppress the variation in accordance with a result of comparison between a resistance value that is detected and a desired value, also for the resistance component in the impedance of the variable termination circuit 14, as indicated in a flowchart in FIG. 7B. FIG. 7B is a flowchart indicating an example of how to store data (data for controlling the resistance value of the variable termination circuit 14 here) in the memory 19*a* in the directional coupler 10 according to the present embodiment. Steps S10*a*, S11*a*, and S12*a* in FIG. 7B correspond to Steps S10, S11, and S12 illustrated in FIG. 7A and the same processing as in FIG. 7A is performed in FIG. 7B except that the "capacitance value" is replaced with the "resistance value". However, in the switch elements for trimming connected in series to the resistors in the variable termination circuit 14, the resistance value is decreased with the increasing number of the switch elements to be short-circuited and the resistance value is increased with the increasing number of the switch elements to be opened.

An example of how to adjust the directional coupler 10 according to the present embodiment will now be described.

Figure 8:
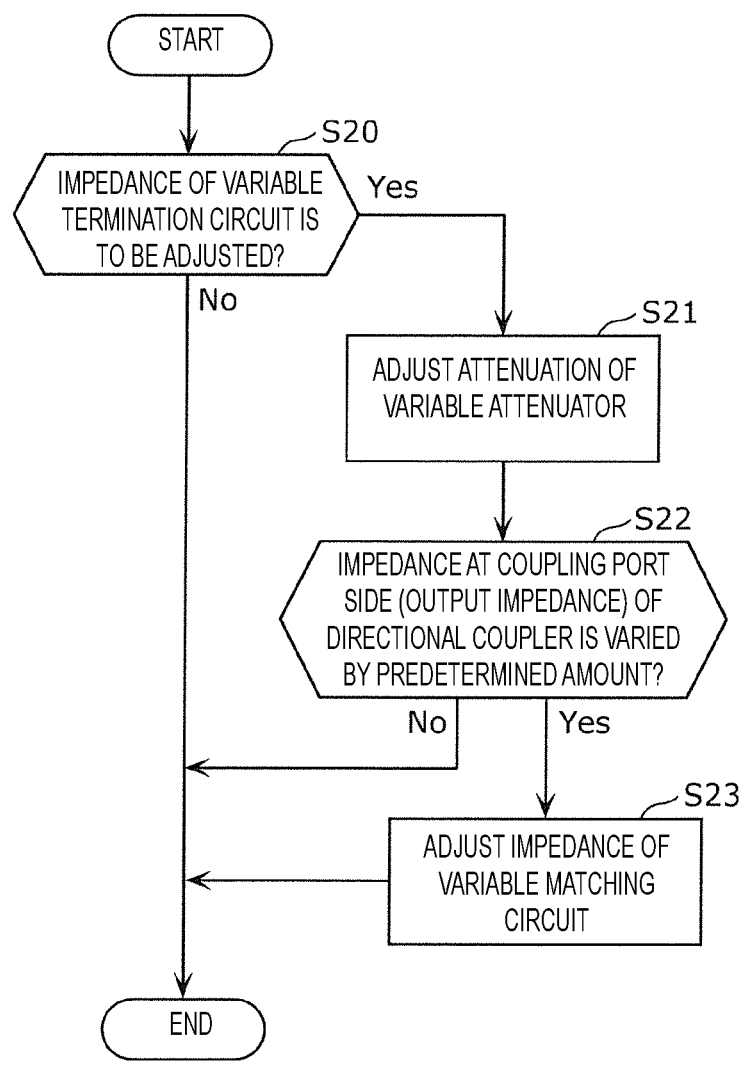
FIG. 8 is a flowchart illustrating an example of how to adjust the directional coupler according to the present embodiment.

FIG. 8 is a flowchart illustrating an example of how to adjust the directional coupler 10 according to the present embodiment.

If the impedance (that is, at least one of the resistance value and the capacitance value) of the variable termination circuit 14 is to be adjusted (Yes in S20), at least the attenuation of the variable attenuator 16 is adjusted (S21). If the impedance of the variable termination circuit 14 is not to be adjusted (No in S20), the attenuation of the variable attenuator 16 is not adjusted.

For example, when the trimming to adjust the impedance of the variable termination circuit 14 based on the data stored in the memory 19*a* is performed, the control circuit 19 performs the trimming to adjust the attenuation of the variable attenuator 16 based on the data stored in the memory 19*a* by the control circuit 19 or performs the tuning to adjust the attenuation of the variable attenuator 16 not based on the data stored in the memory 19*a* (for example, in accordance with the frequency band of the signal propagated on the main line 11) by the control circuit 19 or the external circuit.

When the attenuation of the variable attenuator 16 is adjusted, it is determined whether the impedance at the coupling port 18 side of the directional coupler 10 (the output impedance of the directional coupler 10) after the adjustment of the attenuation is varied by a predetermined amount from that before the adjustment of the attenuation (S22). If the impedance at the coupling port 18 side of the directional coupler 10 (the output impedance) is varied by a predetermined amount (Yes in S22), the impedance of the variable matching circuit 15 is adjusted (S23). If the impedance at the coupling port 18 side of the directional coupler 10 (the output impedance) is not varied by a predetermined amount (No in S22), the impedance of the variable matching circuit 15 is not adjusted.

For example, when the output impedance of the directional coupler 10 is varied by a predetermined amount as the result of the adjustment of the attenuation of the variable attenuator 16, the control circuit 19 performs the trimming to adjust the impedance of the variable matching circuit 15 based on the data stored in the memory 19*a* by the control circuit 19 or performs the tuning to adjust the impedance of the variable matching circuit 15 not based on the data stored in the memory 19*a* (for example, in accordance with the frequency band of the signal propagated on the main line 11) by the control circuit 19 or the external circuit.

Performing the adjustment of the variable attenuator 16 or the variable matching circuit 15 in accordance with the state of the variable termination circuit 14 or the state of the output impedance in the above manner enables the output impedance of the directional coupler 10, which is varied due to the adjustment of the variable termination circuit 14, to be returned to a desired value. As a result, it is possible to stabilize the directivity and the return loss of the directional coupler 10.

As described above, the directional coupler 10 according to the present embodiment includes the main line 11 and the sub-line 12 electromagnetically coupled to each other, the variable termination circuit 14 that is connected to one end of the sub-line 12 and that has a variable impedance, the variable matching circuit 15 that is connected to the other end of the sub-line 12 and that has a variable impedance or the variable attenuator 16 that has a variable attenuation, and the control circuit 19 that controls the impedance of the variable termination circuit 14 and that controls the impedance of the variable matching circuit 15 or the attenuation of the variable attenuator 16. The control circuit 19 includes the non-volatile memory 19*a* and controls the impedance of the variable termination circuit 14 in accordance with the data stored in the memory 19*a*.

With the above configuration, since the impedance of the variable termination circuit 14 is adjusted by the control circuit 19 in accordance with the data stored in the memory 19*a* at one end side of the sub-line 12, the variation in the directivity of the directional coupler 10 is suppressed. In addition, since the impedance of the variable matching circuit 15 or the attenuation of the variable attenuator 16 is adjusted by the control circuit 19 for the output impedance at the other end side of the sub-line 12, which occurs in association with the adjustment of the impedance of the variable termination circuit 14, the variation in the return loss of the directional coupler 10 is also suppressed. Accordingly, the directional coupler 10 capable of achieving the directivity and the return loss more stable than those of directional couplers in the related art is realized.

Here, the memory 19*a* includes a memory device capable of performing writing only once.

With the above configuration, since the data is not modified after the data corresponding to the adjustment of the impedance of the variable termination circuit 14 is written to the memory 19*a*, the adjustment of the impedance of the variable termination circuit 14 is stably continued.

The memory device is, for example, an electrical fuse.

With the above configuration, since the electrical fuse, which is relatively easily manufactured and the manufacturing cost of which is low, is used as the memory device of the memory 19*a*, the directional coupler 10 is easily manufactured.

The control circuit 19 controls the impedance of the variable matching circuit 15 or the attenuation of the variable attenuator 16 in accordance with the data stored in the memory 19*a*.

With the above configuration, not only the impedance of the variable termination circuit 14 but also the impedance of the variable matching circuit 15 or the attenuation of the variable attenuator 16 are adjusted by the control circuit 19 in accordance with the data stored in the memory 19*a*. Accordingly, the trimming to ensure the stable directivity and return loss of the directional coupler 10 is enabled with the data stored in the memory 19*a*.

The variable termination circuit 14 includes the multiple impedance elements 14*a* to 14*f* and the switch elements 14*g* to 14*j* respectively connected to at least one or more impedance elements 14*a*, 14*b*, 14*e*, and 14*f*, among the multiple impedance elements 14*a* to 14*f*. The control circuit 19 short-circuits or opens the switch elements 14*g* and 14*i* in accordance with the data stored in the memory 19*a* to control the impedance of the variable termination circuit 14.

With the above configuration, short-circuiting or opening the switch elements corresponding to the respective multiple impedance elements composing the variable termination circuit 14 in accordance with the data stored in the memory 19*a* to enable or disable the respective impedance elements enables the impedance of the variable termination circuit 14 to be adjusted.

The multiple impedance elements 14*a* to 14*f* include the multiple capacitances (the impedance elements 14*a* and 14*b*) connected in parallel to each other, and the switch elements 14*g* and 14*h* are connected in series to at least one capacitance, among the multiple capacitances (the impedance elements 14*a* and 14*b*).

With the above configuration, since the capacitances connected in parallel are capable of being selected as the components of the variable termination circuit 14, the adjustment of the capacitance components in the impedance of the variable termination circuit 14 is enabled.

The multiple impedance elements include the resistors 141*a* to 141*c* connected in series to each other. The switch elements 141*d* to 141*f* are connected in parallel to at least one resistor, among the multiple resistors.

With the above configuration, since the resistors connected in series are capable of being selected as the components of the variable termination circuit 14, the adjustment of the resistance components in the impedance of the variable termination circuit 14 is enabled.

The multiple impedance elements 14*a* to 14*f* include the multiple resistors (the impedance elements 14*e* and 14*f*) connected in parallel to each other. The switch element 14*i* and 14*j* are connected in series to at least one resistor, among the multiple resistors (the impedance elements 14*e* and 14*f*).

With the above configuration, since the resistors connected in parallel are capable of being selected as the components of the variable termination circuit 14, the adjustment of the resistance components in the impedance of the variable termination circuit 14 is enabled.

The variable matching circuit 15 and the variable attenuator 16 are connected in series to the other end of the sub-line 12.

With the above configuration, since the adjustment of both the impedance of the variable matching circuit 15 and the attenuation of the variable attenuator 16 is enabled at the other end side of the sub-line 12, the variation in the directivity and the return loss of the directional coupler 10 is reliably suppressed.

The directional coupler 10 includes the variable attenuator 16. When the control circuit 19 adjusts (controls) the impedance of the variable termination circuit 14, the control circuit 19 adjusts (controls) at least the attenuation of the variable attenuator 16.

With the above configuration, since the adjustment corresponding to the adjustment of the impedance of the variable termination circuit 14 connected to one end side of the sub-line 12 is capable of being performed at the other end side of the sub-line 12, the variation in the directivity and the return loss of the directional coupler 10 is reliably suppressed.

The variable termination circuit 14 further includes the controlled unit that varies the impedance of the variable termination circuit 14 under control that is not based on the data stored in the memory 19*a*.

With the above configuration, the impedance of the variable termination circuit 14 is capable of being subjected to not only the trimming in accordance with the data stored in the memory 19*a* but also the tuning, which is dynamic adjustment depending on the frequency band or the like of the signal propagated on the main line 11, to improve the directivity of the directional coupler 10.

The control circuit 19 further includes the detection circuit 19*b* that detects the impedance of the variable termination circuit 14 and that generates data to be stored in the memory 19*a* based on the detected impedance.

With the above configuration, since the detection circuit 19*b* in the directional coupler 10 is capable of being used to determine the data to be stored in the memory 19*a*, the trimming is capable of being finished without necessarily preparing a suitable measurement device.

The directional coupler 10 includes the variable matching circuit 15. The variable matching circuit 15 further includes the controlled unit that varies the impedance of the variable matching circuit 15 under control that is not based on the data stored in the memory 19*a*.

With the above configuration, the impedance of the variable matching circuit 15 is capable of being subjected to the tuning, which is the dynamic adjustment depending on the frequency band or the like of the signal propagated on the main line 11 to more appropriately match the output impedance of the directional coupler 10.

The directional coupler 10 includes the variable attenuator 16. The variable attenuator 16 further includes the controlled unit that varies the attenuation of the variable attenuator 16 under control that is not based on the data stored in the memory 19*a*.

With the above configuration, the attenuation of the variable attenuator 16 is capable of being subjected to the tuning, which is the dynamic adjustment depending on the frequency band or the like of the signal propagated on the main line 11, to more appropriately set the degree of coupling of the directional coupler 10.

The directional coupler 10 includes the variable filter 17 connected to the other end of the sub-line 12.

With the above configuration, the frequency characteristics of the directional coupler 10 are capable of being appropriately adjusted.

Although the directional coupler 10 according to the present disclosure is described above based on the embodiment and the modification, the present disclosure is not limited to the embodiment and the modification. Aspects realized by making various changes supposed by the person skilled in the art to the embodiment and the modification within the spirit and scope of the present disclosure and other aspects build by combining part of the components in the embodiment and the modification are also included in the scope of the present disclosure.

For example, although the directional coupler 10 according to the above embodiment includes the switch circuit 13, the switch circuit 13 is not necessarily provided. The variable termination circuit 14 may be fixedly connected to one end of the sub-line 12 and the variable matching circuit 15, the variable attenuator 16, and the variable filter 17 may be fixedly connected to the other end thereof. Since the variable termination circuit 14 and at least one of the variable matching circuit 15 and the variable attenuator 16 are controlled by the control circuit 19 even in a case in which the directional coupler 10 is a unidirectional coupler that fixedly extracts one of the traveling waves and the reflected waves on the line, the directional coupler capable of achieving the stable directivity and return loss is realized.

Although the directional coupler 10 according to the above embodiment is provided with the variable matching circuit 15, the variable attenuator 16, and the variable filter 17 at the other end side of the sub-line 12, all of these components may not be necessarily provided. With at least one of the variable matching circuit 15 and the variable attenuator 16, the output impedance at the other end side of the sub-line 12, which occurs in association with the adjustment of the impedance of the variable termination circuit 14, can be adjusted using at least one of the variable matching circuit 15 and the variable attenuator 16.

If at least one of the variable matching circuit 15 and the variable attenuator 16 is provided at the other end side of the sub-line 12, the other of the variable matching circuit 15 and the variable attenuator 16 may be of a fixed type, instead of a variable type. Similarly, the variable filter is an arbitrary component and the frequency band of the variable filter may be of a fixed type. In addition, the order of connection of the variable matching circuit 15, the variable attenuator 16, and the variable filter 17 is not limited to the order in the above embodiment, and the variable matching circuit 15, the variable attenuator 16, and the variable filter 17 may be connected in an arbitrary order.

Although the directional coupler 10 according to the above embodiment includes the detection circuit 19*b*, the detection circuit 19*b* is not necessarily provided. It is possible to generate the data to be stored in the memory 19*a*, which is used for trimming of the variable termination circuit 14, using a device that measures the impedance of the variable termination circuit 14, which is provided separately from the directional coupler 10.

Although the variable termination circuit 14 includes the switch elements for trimming and the switch elements for tuning in the directional coupler 10 according to the above embodiment, the variable termination circuit 14 may not necessarily include the switch elements for tuning. Since the impedance of the variable termination circuit 14 is adjusted by the control circuit 19 in accordance with the data stored in the memory 19*a* when the variable termination circuit 14 includes the switch elements for trimming, the variation in the directivity of the directional coupler is suppressed. In addition, the variable termination circuit 14 may include an inductor as a passive element.

Similarly, although the variable matching circuit 15, the variable attenuator 16, and the variable filter 17 include the switch elements for trimming and the switch elements for tuning in the directional coupler 10 according to the above embodiment, the variable matching circuit 15, the variable attenuator 16, and the variable filter 17 may not necessarily include these switch elements. Since at least one of the impedance of the variable matching circuit 15 and the attenuation of the variable attenuator 16 is adjusted by the control circuit 19 or the external circuit in association with the trimming of the variable termination circuit 14 when at least one of the variable matching circuit 15 and the variable attenuator 16 includes the switch elements for trimming or tuning, the variation in the directivity and the return loss of the directional coupler is suppressed.

INDUSTRIAL APPLICABILITY

The present disclosure is usable as the directional coupler that extracts the power of the traveling waves of the radio-frequency signal propagated on the line, particularly, as the directional coupler capable of achieving the stable directivity and return loss over the mass-produced product.

REFERENCE SIGNS LIST 10 directional coupler
11 main line
12 sub-line
13 switch circuit
13a, 13b switch element
14 variable termination circuit
14a to 14f impedance element
14g to 14j switch element
141a to 141c resistor
141d to 141f switch element
15 variable matching circuit
15a to 15e capacitance
15f, 15g inductor
15h to 15n switch element
16 variable attenuator
16a to 16c variable resistor
161a to 163a resistor
16g to 16i, 164a to 166a switch element
17 variable filter
17a to 17f, 171e to 173e capacitance
17g inductor
17h to 17j, 174e to 176e switch element
18 coupling port
19 control circuit
19a memory
19a1 to 19a3 electrical fuse
19b detection circuit
191 to 193 level shifter

The invention claimed is:

1. A directional coupler comprising:
a main line and a sub-line electromagnetically coupled to each other;
a variable termination circuit that is connected to a first end of the sub-line, the variable termination circuit having a variable impedance;
a variable matching circuit having a variable impedance or a variable attenuator having a variable attenuation, the variable matching circuit or the variable attenuator being connected to a second end of the sub-line; and
a control circuit configured to control the impedance of the variable termination circuit, and to control the impedance of the variable matching circuit or the attenuation of the variable attenuator,
wherein the control circuit comprises a non-volatile memory and is configured to control the impedance of the variable termination circuit in accordance with data stored in the memory, and
wherein the variable termination circuit further comprises a switch configured to vary the impedance of the variable termination circuit not based on the data stored in the memory.

2. The directional coupler according to claim 1,
wherein the variable termination circuit comprises a plurality of impedance elements and a switch connected to at least one of the impedance elements, and
wherein the control circuit is configured to control the impedance of the variable termination circuit by short-circuiting or opening the switch in accordance with the data stored in the memory.

3. The directional coupler according to claim 2,
wherein the plurality of impedance elements comprises a plurality of capacitances connected in parallel to each other, and
wherein the switch is connected in series to at least one of the capacitances.

4. The directional coupler according to claim 2,
wherein the plurality of impedance elements comprises a plurality of resistors connected in series to each other, and
wherein the switch is connected in parallel to at least one of the resistors.

5. The directional coupler according to claim 2,
wherein the plurality of impedance elements comprises a plurality of resistors connected in parallel to each other, and
wherein the switch is connected in series to at least one of the resistors.

6. The directional coupler according to claim 1, wherein the memory is configured to perform only one writing operation.

7. The directional coupler according to claim 6, wherein the memory comprises an electrical fuse.

8. The directional coupler according to claim 1, wherein the control circuit is further configured to control the impedance of the variable matching circuit or the attenuation of the variable attenuator in accordance with the data stored in the memory.

9. The directional coupler according to claim 1, wherein the variable matching circuit or the variable attenuator is connected in series to the second end of the sub-line.

10. The directional coupler according to claim 1,
wherein the directional coupler comprises the variable attenuator, and
wherein, when the control circuit controls the impedance of the variable termination circuit, the control circuit is further configured to control the attenuation of the variable attenuator.

11. The directional coupler according to claim 1, wherein the control circuit further comprises a detection circuit configured to detect the impedance of the variable termination circuit and to generate data to be stored in the memory based on the detected impedance.

12. The directional coupler according to claim 1,
wherein the directional coupler comprises the variable matching circuit, and
wherein the variable matching circuit further comprises a switch configured to vary the impedance of the variable matching circuit not based on the data stored in the memory.

13. The directional coupler according to claim 1,
wherein the directional coupler comprises the variable attenuator, and
wherein the variable attenuator further comprises a switch configured to vary the attenuation of the variable attenuator not based on the data stored in the memory.

14. The directional coupler according to claim 1, further comprising:
a variable filter connected to the second end of the sub-line.

* * * * *